United States Patent
Lee et al.

(10) Patent No.: US 10,440,857 B2
(45) Date of Patent: Oct. 8, 2019

(54) DETECTION SYSTEM AND METHOD OF SIGNAL TRANSMISSION DELAY FOR FAN CHIP

(71) Applicant: Sentelic Corporation, Taipei (TW)

(72) Inventors: Wen-Ting Lee, Taipei (TW); Chung-Chih Fang, Taipei (TW); Li-Wei Lin, Taipei (TW)

(73) Assignee: Sentelic Corporation, Taipei (TW)

( * ) Notice: Subject to any disclaimer, the term of this patent is extended or adjusted under 35 U.S.C. 154(b) by 43 days.

(21) Appl. No.: 15/963,087

(22) Filed: Apr. 25, 2018

(65) Prior Publication Data
US 2019/0182983 A1    Jun. 13, 2019

(30) Foreign Application Priority Data
Dec. 8, 2017    (TW) .............................. 106143101 A

(51) Int. Cl.
| | |
|---|---|
| H05K 7/20 | (2006.01) |
| H03K 5/14 | (2014.01) |
| H03K 5/26 | (2006.01) |
| G05B 19/042 | (2006.01) |
| H03K 5/156 | (2006.01) |
| G06F 1/20 | (2006.01) |
| H03K 5/00 | (2006.01) |

(52) U.S. Cl.
CPC ....... H05K 7/20209 (2013.01); G05B 19/042 (2013.01); H03K 5/14 (2013.01); H03K 5/1565 (2013.01); H03K 5/26 (2013.01); G06F 1/206 (2013.01); H03K 2005/00078 (2013.01)

(58) Field of Classification Search
None
See application file for complete search history.

(56) References Cited

U.S. PATENT DOCUMENTS

| | | | |
|---|---|---|---|
| 6,404,338 B1 | 6/2002 | Koslar | |
| 9,785,156 B2* | 10/2017 | Sato | ........................ B60R 16/02 |
| 9,830,244 B2* | 11/2017 | Henneberger | .... H04L 12/40195 |
| 10,075,284 B1* | 9/2018 | Rodrigues | ............... H04L 7/033 |
| 2007/0200518 A1* | 8/2007 | Verge | .................. H05K 7/20209 |
| | | | 318/268 |
| 2015/0071646 A1* | 3/2015 | Jau | ........................ H04B 10/803 |
| | | | 398/128 |

(Continued)

FOREIGN PATENT DOCUMENTS

TW        201234826 A    8/2012

*Primary Examiner* — Bernard G Lindsay
(74) *Attorney, Agent, or Firm* — CKC & Partners Co., LLC

(57) ABSTRACT

The invention provides a detection system and method of signal transmission delay for fan chip. The detection system comprises a circuit board, a fan chip and a control unit. The control unit generates a first pulse signal having a specific pulse pattern, and send the first pulse signal to the fan chip. When the fan chip is operating in a detection mode of signal transmission delay according to the first pulse signal, the fan chip copies the specific pulse pattern of the first pulse signal to generate a second pulse signal having the specific pulse pattern, and send the second pulse signal to the control unit. The control unit calculates a time difference between a time that sends the first pulse signal and a time that receives the second pulse signal, so as to obtain a delay time of signal transmission between the control unit and the fan chip.

10 Claims, 2 Drawing Sheets

(56) References Cited

U.S. PATENT DOCUMENTS

2015/0108934 A1* 4/2015 Wong .................. F04D 25/0613
                                                              318/472
2017/0337881 A1* 11/2017 Zhang .................. G09G 3/3406

* cited by examiner

DETECTION SYSTEM AND METHOD OF SIGNAL TRANSMISSION DELAY FOR FAN CHIP

This non-provisional application claims priority claim under 35 U.S.C. § 119 (a) on Taiwan Patent Application No. 106143101 filed Dec. 8, 2017, the entire contents of which are incorporated herein by reference.

FIELD OF THE INVENTION

The present invention relates to a detection system and method, more particularly, to a detection system and method of signal transmission delay for fan chip.

BACKGROUND

With the quick development of science and technology, the electronic device can be given more functionality to enhance the cost performance ratio of the electronic device. The electronic device having multi-function usually need to be configured more electronic components inside thereof. These electronic components increase not only the circuit density of the electronic device, but also the operating temperature of the electronic device. In order to avoid that the electronic device is overheating during the operation, the electronic device will be usually provided with a fan inside thereof. The electronic device in operating can be dissipated heat by the rotation of the fan. The operation of the fan is controlled by a fan chip so that the fan in operation is able to reach the required rotational speed.

The fan chip usually receives a pulse control signal from an external control unit via an input pin to control the related operations of fan according to the indication of the external pulse control signal. Besides, the fan chip is generally configured on a circuit board, the signal generated by the external control unit must be sent to the fan chip via these circuit wiring and electronic components on the circuit board. These circuit wiring and electronic components will cause a delay of signal transmission between the external control unit and the fan chip. Afterwards, if the delay of signal transmission between the external control unit and the fan chip is not detected and processed, which may make errors occurred in the controlling for the fan, and therefore affect the normal operation of other circuits.

SUMMARY

It is one objective of the present invention to provide a detection system and method of signal transmission delay for fan chip, in which can execute a detection process of signal transmission delay for a fan chip so as to detect a delay time of signal transmission between an external control unit and the fan chip; afterwards, the detection system, based on the detected delay time, performs the related processing before controlling the operation of fan, in such a way that the fan can be operated in a rated speed at a predetermined time, so that other circuits in the electronic device can operate more smoothly.

To achieve the above object, the present invention provides a detection system of signal transmission delay for fan chip, comprising: a circuit board comprising a circuit unit, wherein the circuit unit comprises at least one circuit wiring and at least one electronic component; a fan chip, configured on the circuit board, and comprising an input pin and an output pin; and a control unit connected to the fan chip via the circuit unit of the circuit board; wherein when the control unit wants to execute a detection process of signal transmission delay for the fan chip, the control unit will generate a first pulse signal having a specific pulse pattern, send the first pulse signal to the fan chip via the circuit unit of the circuit board, and record a time that sends the first pulse signal; when the fan chip receives the first pulse signal via the input pin, the fan chip will be operated in a detection mode of signal transmission delay according to the first pulse signal having the specific pulse pattern; when the fan chip is operated in the detection mode of signal transmission delay, the fan chip will copy the specific pulse pattern of the first pulse signal to generate a second pulse signal having the specific pulse pattern, and send the second pulse signal to the control unit via the output pin and the circuit unit of the circuit board; when the control unit receives the second pulse signal, the control unit will record a time that receives the second pulse signal, and calculate a time difference between the time that receives the second pulse signal and the time that sends the first pulse signal; accordingly, the time difference is a delay time of signal transmission between the control unit and the fan chip.

In one embodiment of the present invention, the specific pulse pattern of the first pulse signal or the second pulse signal is formulated with a specific number of pulses and a specific duty ratio of pulse.

In one embodiment of the present invention, the control unit is configured on the circuit board, or is a component provided outside the circuit board.

In one embodiment of the present invention, the control unit comprises a timer, the control unit, by the timer, records the time that sends the first pulse signal and the time that receives the second pulse signal.

In one embodiment of the present invention, when the control unit wants to execute a fan operation process for the fan chip, the control unit will generate a fan operation pulse signal and send the fan operation pulse signal to the fan chip via the circuit unit of the circuit board, the fan chip receives the fan operation pulse signal via the input pin so as to enter a fan operation mode according to the fan operation pulse signal; when the fan chip is operated in the fan operation mode, the fan chip will generate a corresponding control command that indicates a rotation speed according to a duty ratio of each of pulses in the fan operation pulse signal, and send the control command to a fan so that the fan is able to be operated in a predetermined rotation speed by the controlling of the control command.

In one embodiment of the present invention, the fan chip comprises a first firmware or a comparison circuit, when the fan chip receives a pulse signal sent from the control unit, it will determine that the pulse signal is the fan operation pulse signal or the first pulse signal having the specific pulse pattern by the first firmware or the comparison circuit, and therefore decide to be operated in the fan operation mode or the detection mode of signal transmission delay.

In one embodiment of the present invention, the control unit is a controller, a processor, or a BIOS.

The present invention further provides a detection method of signal transmission delay for fan chip, which is applied in a detection system, the detection system comprises a circuit board, a fan chip, and a control unit, the circuit board comprises a circuit unit having at least one circuit wiring and at least one electronic component, the fan chip is configured on the circuit board, the control unit is electrically connected to the fan chip via the circuit unit, steps of the detection method comprising: executing a detection process of signal transmission delay for the fan chip by the control unit, steps of the detection process of signal transmission delay comprising: generating a first pulse signal having a specific pulse pattern by the control unit and sending the first pulse signal to the fan chip via the circuit unit of the circuit board; recording a time that sends the first pulse signal by the control unit; receiving the first pulse signal by the fan chip; enabling the fan chip to operate in a detection mode of signal transmission delay according to the specific pulse pattern of the first pulse signal; enabling the fan chip to generate a second pulse signal having the specific pulse pattern based on copying the specific pulse pattern of the first pulse signal, and send the second pulse signal to the control unit via the circuit unit of the circuit board; receiving the second pulse signal and recording a time that receives the second pulse signal by the control unit; and calculating a time difference between the time that receives the second pulse signal and the time that sends the first pulse signal by the control unit, wherein the time difference is a delay time of signal transmission between the control unit and the fan chip.

In one embodiment of the present invention, the control unit can further execute a fan operation process for the fan chip, steps of the fan operation process comprising: generating a fan operation pulse signal by the control unit and sending the fan operation pulse signal to the fan chip via the circuit unit of the circuit board; enabling the fan chip to enter a fan operation mode when it receives the fan operation pulse signal; and enabling the fan chip to generate a corresponding control command that indicates a rotation speed according to a duty ratio of each of pulses in the fan operation pulse signal, and send the control command to a fan so that the fan is able to be operated in a predetermined rotational speed by the controlling of the control command.

In one embodiment of the present invention, the fan chip comprises a first firmware or a comparison circuit, the steps of the detection method further comprising: receiving a pulse signal sent from the control unit by the fan chip; and determining that the pulse signal is the fan operation pulse signal or the first pulse signal by the first firmware or the comparison circuit of the fan chip.

DETAILED DESCRIPTION OF THE PREFERRED EMBODIMENTS

Figure 1:
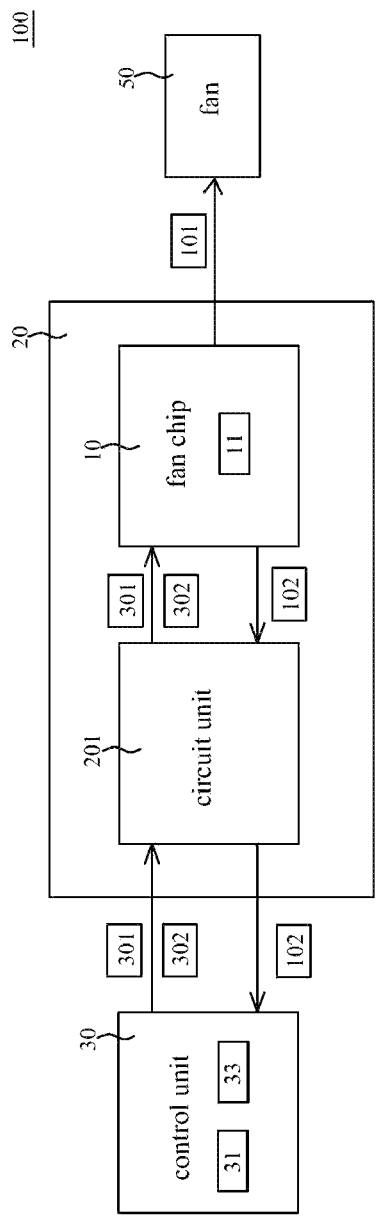
FIG. 1 is a circuit block diagram of a detection system for signal transmission delay of fan chip according to one embodiment of the present invention.
Figure 2:
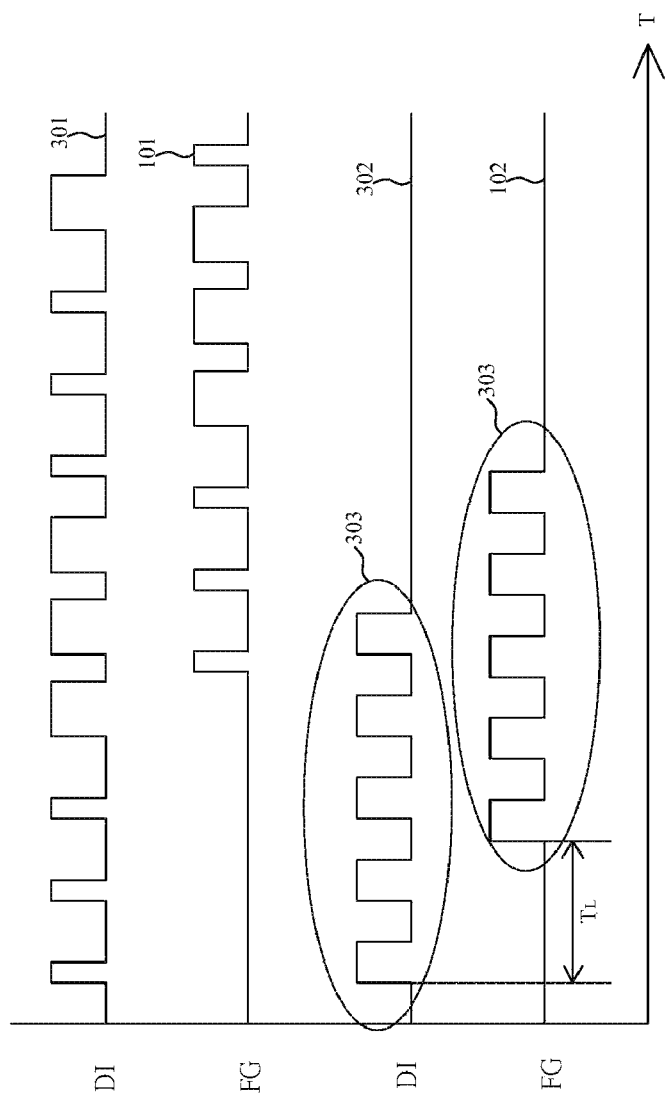
FIG. 2 is a signal waveform diagram of fan chip operated in a fan operation mode or a detection mode of signal transmission delay according to the present invention.

Referring to FIGS. 1 and 2, there are shown a circuit block diagram of a detection system for signal transmission delay of fan chip according to one embodiment of the present invention, and a signal waveform diagram of fan chip operated in a fan operation mode or a detection mode of signal transmission delay according to the present invention. The detection system 100 of the present invention is applied in an electronic device, and used for detecting the signal transmission delay of fan chip inside the electronic device. As shown in FIG. 1, the detection system 100 comprises a fan chip 10, a circuit board 20, a control unit 30, and a fan 50. The circuit board 20 is a printed circuit board, and comprises a circuit unit 201. The circuit unit 201 is circuit wiring and electronic components configured on the circuit board 20. The control unit 30 is electrically connected the fan chip 10 via the circuit unit 201 of the circuit board 20. One embodiment of the present invention, the control unit 30 is selectively configured on the circuit board 20. Another embodiment of the present invention, the control unit 30 may be a component provided outside the circuit board 20.

As described in the background, the fan chip 10 is generally configured on the circuit board 20, the signal generated by the external control unit 30 must be sent to the fan chip 10 via the circuit unit 201 (such as circuit wiring and electronic components) on the circuit board 20. The circuit unit 201 will cause a delay of signal transmission between the external control unit 30 and the fan chip 20. Afterwards, if the delay of signal transmission between the external control unit 30 and the fan chip 20 is not detected and processed, which may make errors occurred in the controlling for the fan 50, and therefore affect the normal operation of other circuits. Accordingly, the detection system 100 of the present invention detects a delay time of signal transmission between the control unit 30 and the fan chip 10 so as to know the influence of the circuit unit 201 of the circuit board 20 on the signal transmission between the control unit 30 and the fan chip 10.

The fan chip 10 comprises an input pin (DI), an output pin (FG), a power pin, and a ground pin. The control unit 30 may be a controller, a processor, or a BIOS (Basic Input/Output System), and used for deciding the operation mode (such as a fan operation mode or a detection mode of signal transmission delay) of the fan chip 10. The fan chip 10 comprises a first firmware 11.

With referring to FIG. 2, further, when the control unit 30 wants to execute a fan operation process for the fan chip 10, it will generate a fan operation pulse signal 301, and send the fan operation pulse signal 301 to the fan chip 10 via the circuit unit 201 of the circuit board 20. After the fan chip 10 receives the fan operation pulse signal 301 via the input pin (DI), it will enter a fan operation mode. When the fan chip 10 is operating in the fan operation mode, it will generate a corresponding control command 101 that indicates a rotation speed according to a duty ratio of each of pulses in the fan operation pulse signal 301, respectively, and send the control command 101 to the fan 50 so that the fan 50 is able to be operated in a predetermined rotational speed by the controlling of the control command 101.

On the contrary, when the control unit 30 wants to execute a detection process of signal transmission delay for the fan chip 10, it will generate a first pulse signal 302 having a specific pulse pattern 303, send the first pulse signal 302 to the fan chip 10 via the circuit unit 201 of the circuit board 20. In the present invention, the specific pulse pattern 303 of the first pulse signal 302 is an information that is used for indicating the fan chip 10 to be operated in the detection mode of signal transmission delay. Besides, the control unit 30 of the present invention further comprises a timer 31. When the control unit 30 sends the first pulse signal 302 to the fan chip 10, the timer 31 will record a time (Ts) that sends the first pulse signal 302. Afterwards, when the fan chip 10 receives the first pulse signal 302 via the input pin (DI), it will enter the operation of the detection mode of signal transmission delay. When the fan chip 10 is operating in the detection mode of signal transmission delay, it will copy the specific pulse pattern 303 of the first pulse signal 302 to generate a second pulse signal 102 having the specific pulse pattern 303, and send the second pulse signal 102 to the control unit 30 via the output pin and the circuit unit 201 of the circuit board 20. When the control unit 30 receives the second pulse signal 102, the timer 31 will record a time (Tr) that receives the second pulse signal 102, and calculate a time difference ($T_L$=Tr−Ts) between the time (Tr) that receives the second pulse signal 102 and the time (Ts) that sends the first pulse signal 302. Accordingly, the time difference ($T_L$) is a delay time of signal transmission between the control unit 30 and the fan chip 10.

Furthermore, the specific pulse pattern 303 of the first pulse signal 302 of the present invention is formulated with a specific number of pulses and a specific duty ratio of pulse, for example, the specific pulse pattern 303 is having five pulses, in which the duty ratio of each of pulses is 50%. When the fan chip 10 receives a pulse signal sent from the control unit 30 via the input pin (DI), the first firmware 11 of the fan chip 10 determines whether the number of pulses and the duty ratio of pulse in the pulse signal sent from the control unit 30 are equal to the number of pulses and the duty ratio of pulse in the specific pulse pattern 303. If the first firmware 11 of the fan chip 10 determines that the number of pulses and the duty ratio of pulse in the pulse signal sent from the control unit 30 are equal to the number of pulses and the duty ratio of pulse in the specific pulse pattern 303, the fan chip 10 enters the detection mode of signal transmission delay, else the fan chip 10 enters the fan operation mode. In the present invention, the fan chip 10 can determine the pulse signal 301/302 sent from the control unit 30 in a way of firmware (such as the first firmware 11); of course, the fan chip 10 can also select to determine the pulse signal 301/302 sent from the control unit 30 in a way of hardware, for example, the hardware is a comparison circuit consisted of at least one comparator.

Accordingly, the detection system 100 executes the detection process of signal transmission delay for the fan chip 10, so as to detect the delay time ($T_L$) of signal transmission between the control unit 30 and the fan chip 10. Afterwards, the detection system 100, based on the detected delay time ($T_L$), performs the related processing before controlling the operation of fan 50, in such a way that the fan 50 can be operated in a rated speed at a predetermined time, so that other circuits in the electronic device can operate more smoothly.

The above disclosure is only the preferred embodiment of the present invention, and not used for limiting the scope of the present invention. All equivalent variations and modifications on the basis of shapes, structures, features and spirits described in the claims of the present invention should be included in the claims of the present invention.

The invention claimed is:

1. A detection system of signal transmission delay for a fan chip, comprising:
   a circuit board comprising a circuit unit, wherein the circuit unit comprises at least one circuit wiring and at least one electronic component;
   a fan chip, configured on the circuit board, and comprising an input pin and an output pin,
   wherein the fan chip operates in a detection mode of signal transmission delay or a fan operation mode to control a fan;
   and a control unit connected to the fan chip via the circuit unit of the circuit board;
   wherein when the control unit executes a detection process of signal transmission delay for the fan chip, the control unit generates a first pulse signal having a specific pulse pattern, sends the first pulse signal to the fan chip via the circuit unit of the circuit board, and records a time that the first pulse signal was sent;
   wherein responsive to the fan chip receiving the first pulse signal via the input pin, the fan chip operates in a detection mode of signal transmission delay according to the first pulse signal having the specific pulse pattern;
   wherein when the fan chip operates in the detection mode of signal transmission delay, the fan chip copies the specific pulse pattern of the first pulse signal to generate a second pulse signal having the specific pulse pattern, and sends the second pulse signal to the control unit via the output pin and the circuit unit of the circuit board;
   wherein when the control unit receives the second pulse signal, the control unit records a time that the second pulse signal was received, and calculates a time difference between the time that the second pulse signal was received and the time that the first pulse signal was sent;
   wherein the time difference is a delay time of signal transmission between the control unit and the fan chip and the fan is operated based on the delay time of signal transmission between the control unit and the fan chip.

2. The detection system according to claim 1, wherein the specific pulse pattern of the first pulse signal or the second pulse signal is formulated with a specific number of pulses and a specific duty ratio of pulse.

3. The detection system according to claim 1, wherein the control unit is configured on the circuit board, or is a component provided outside the circuit board.

4. The detection system according to claim 1, wherein the control unit comprises a timer, the control unit, by the timer, records the time that sends the first pulse signal and the time that receives the second pulse signal.

5. The detection system according to claim 1, wherein when the control unit executes a fan operation process for the fan chip, the control unit generates a fan operation pulse signal and sends the fan operation pulse signal to the fan chip via the circuit unit of the circuit board, the fan chip receives the fan operation pulse signal via the input pin so as to enter a fan operation mode according to the fan operation pulse signal;
   when the fan chip is operated in the fan operation mode, the fan chip generates a corresponding control command that indicates a rotation speed according to a duty ratio of each of pulses in the fan operation pulse signal, and sends the control command to the fan so that the fan operates in a predetermined rotation speed by the controlling of the control command.

6. The detection system according to claim 5, wherein the fan chip comprises a first firmware or a comparison circuit, when the fan chip receives a pulse signal sent from the control unit, it determines that the pulse signal is the fan operation pulse signal or the first pulse signal having the specific pulse pattern by the first firmware or the comparison circuit, and therefore decides to operate in the fan operation mode or the detection mode of signal transmission delay.

7. The detection system according to claim 1, wherein the control unit is a controller, a processor, or a BIOS (Basic Input/Output System).

8. A detection method of signal transmission delay for fan chip, which is applied in a detection system, the detection system comprises a circuit board, a fan chip, and a control unit, the circuit board comprises a circuit unit having at least one circuit wiring and at least one electronic component, the fan chip is configured on the circuit board, the control unit is electrically connected to the fan chip via the circuit unit, wherein the fan chip operates in a detection mode of signal transmission delay or a fan operation mode to control a fan, the steps of the detection method comprising:

executing a detection process of signal transmission delay for the fan chip by the control unit, the steps of the detection process of signal transmission delay comprising:

generating a first pulse signal having a specific pulse pattern by the control unit and sending the first pulse signal to the fan chip via the circuit unit of the circuit board;

recording a time that the first pulse signal was sent by the control unit;

receiving the first pulse signal by the fan chip;

responsive to receiving the first pulse signal, the fan chip operating in a detection mode of signal transmission delay according to the specific pulse pattern of the first pulse signal;

the fan chip generating a second pulse signal having the specific pulse pattern based on copying the specific pulse pattern of the first pulse signal, and sending the second pulse signal to the control unit via the circuit unit of the circuit board;

receiving the second pulse signal and recording a time that receives the second pulse signal by the control unit; and calculating a time difference between the time that the second pulse signal was received and the time that the first pulse signal was sent by the control unit, wherein the time difference is a delay time of signal transmission between the control unit and the fan chip and the fan is operated based on the delay time of signal transmission between the control unit and the fan chip.

9. The detection method according to claim 8, wherein the control unit further executes a fan operation process for the fan chip, the steps of the fan operation process comprising: generating a fan operation pulse signal by the control unit and sending the fan operation pulse signal to the fan chip via the circuit unit of the circuit board; the fan chip entering a fan operation mode when it receives the fan operation pulse signal; and the fan chip generating a corresponding control command that indicates a rotation speed according to a duty ratio of each of pulses in the fan operation pulse signal, and sending the control command to the fan so that the fan is able to be operated in a predetermined rotation speed by the controlling of the control command.

10. The detection method according to claim 9, wherein the fan chip comprises a first firmware or a comparison circuit, the steps of the detection method further comprising:

receiving a pulse signal sent from the control unit by the fan chip; and determining that the pulse signal is the fan operation pulse signal or the first pulse signal by the first firmware or the comparison circuit of the fan chip.

* * * * *